(12) United States Patent
Lawange et al.

(10) Patent No.: US 12,228,953 B2
(45) Date of Patent: Feb. 18, 2025

(54) FAULT COMMUNICATION IN VOLTAGE REGULATOR SYSTEMS

(71) Applicant: MAXLINEAR, INC., Carlsbad, CA (US)

(72) Inventors: Omeshwar Lawange, Carlsbad, CA (US); Vinit Jayaraj, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 135 days.

(21) Appl. No.: 17/654,805

(22) Filed: Mar. 14, 2022

(65) Prior Publication Data

US 2022/0300019 A1 Sep. 22, 2022

Related U.S. Application Data

(60) Provisional application No. 63/163,674, filed on Mar. 19, 2021.

(51) Int. Cl.
| | |
|---|---|
| *G05F 1/56* | (2006.01) |
| *G05F 1/567* | (2006.01) |
| *H02M 1/00* | (2007.01) |
| *H03M 1/50* | (2006.01) |
| *H03M 1/66* | (2006.01) |
| *H03M 1/72* | (2006.01) |

(52) U.S. Cl.
CPC ............ *G05F 1/567* (2013.01); *H03M 1/508* (2013.01); *H03M 1/662* (2013.01); *H03M 1/72* (2013.01)

(58) Field of Classification Search
CPC ......... H02M 1/08; G05F 1/567; H03M 1/508; H03M 1/662; H03M 1/72
See application file for complete search history.

(56) References Cited

U.S. PATENT DOCUMENTS

| | | | |
|---|---|---|---|
| 6,448,914 B1 | 9/2002 | Younis et al. | |
| 8,169,765 B2 * | 5/2012 | Matsunaga | H04L 25/0282 361/160 |
| 9,673,809 B1 * | 6/2017 | Kandah | H03K 17/691 |
| 10,110,152 B1 | 10/2018 | Hajati | |
| 2004/0067060 A1 * | 4/2004 | Aronson | H04B 10/66 398/135 |
| 2006/0028367 A1 | 2/2006 | Kim | |
| 2016/0118974 A1 * | 4/2016 | Terasawa | H02H 3/16 361/93.8 |

(Continued)

FOREIGN PATENT DOCUMENTS

EP 4117181 A1 * 1/2023 ............. H03K 3/011

OTHER PUBLICATIONS

Office Action of Chinese Patent Application No. 202210276553.4 dated Nov. 5, 2024, 17 pgs with translations.

(Continued)

*Primary Examiner* — Sisay G Tiku
(74) *Attorney, Agent, or Firm* — Buchalter; Jason W. Croft

(57) ABSTRACT

A system may include a voltage regulator controller and a driver. The voltage regulator controller may be configured to maintain a phase voltage. The driver may be associated with the phase voltage. The driver may include a first signal line that may be communicatively coupled to the voltage regulator controller. The driver may be configured to transmit a multiplexed signal on the first signal line to the voltage regulator controller.

17 Claims, 10 Drawing Sheets

(56) References Cited

U.S. PATENT DOCUMENTS

| | | | |
|---|---|---|---|
| 2016/0154037 A1* | 6/2016 | Kasturi | G01R 19/0084 |
| | | | 323/271 |
| 2017/0031782 A1 | 2/2017 | Totten et al. | |
| 2017/0110963 A1* | 4/2017 | Mattingly | G01R 31/40 |
| 2017/0214341 A1* | 7/2017 | Matthews | H02P 6/153 |
| 2018/0267915 A1* | 9/2018 | Fujie | G06F 13/362 |
| 2018/0269786 A1* | 9/2018 | Mirjafari | H02M 3/1584 |
| 2019/0207742 A1* | 7/2019 | Haroun | H02P 6/00 |
| 2020/0076416 A1* | 3/2020 | Bang | H03K 17/0822 |
| 2020/0333386 A1 | 10/2020 | Bennett et al. | |
| 2022/0300019 A1 | 9/2022 | Lawange et al. | |
| 2023/0009382 A1* | 1/2023 | Song | H03K 17/163 |
| 2023/0035640 A1* | 2/2023 | Lee | G11C 5/147 |
| 2023/0375610 A1* | 11/2023 | Sealey | G01R 31/083 |

OTHER PUBLICATIONS

Chen, "D/A conversion and A/D conversion", Chapter 8 of Pulse and Digital Circuits, Third Edition, China Edition Library CIP Data Kernel, Jul. 1999, 8 pgs with translations.

Ma et al., "Serial Communication of 80C51 Single Chip Microcomputer", Chapter 8 of Principle and Application of Single Chip Microcomputer: Simulation Technology based on Keil and Proteus, China Edition Library CIP Data Kernel, Dec. 2020, 8 pgs with translations.

\* cited by examiner

FAULT COMMUNICATION IN VOLTAGE REGULATOR SYSTEMS

FIELD

Embodiments described herein relate to fault communication in voltage regulator systems which may include a voltage regulator controller and a driver.

BACKGROUND

Unless otherwise indicated in the present disclosure, the materials described in the present disclosure are not prior art to the claims in the present application and are not admitted to be prior art by inclusion in this section.

A voltage regulator system may be configured to maintain a particular voltage. Some voltage regulator systems may include a controller and a driver for maintaining particular voltages. One or more signal lines may be disposed between the controller and the driver in furtherance of maintaining the particular voltages.

The subject matter claimed in the present disclosure is not limited to implementations that solve any disadvantages or that operate only in environments such as those described above. Rather, this background is only provided to illustrate one example technology area where some implementations described in the present disclosure may be practiced.

SUMMARY

In an embodiment, a system includes a voltage regulator controller and a driver. The voltage regulator controller is configured to maintain a phase voltage. The driver is associated with the phase voltage. The driver includes a first signal line that is communicatively coupled to the voltage regulator controller. The driver is configured to transmit a multiplexed signal on the first signal line to the voltage regulator controller.

In another embodiment, a system includes a voltage regulator controller and multiple drivers. The voltage regulator controller is configured to maintain multiple phase voltages. The multiple drivers are each associated with a phase voltage of the multiple phase voltages. The multiple drivers each include a first signal line of multiple signal lines that are shorted together and communicatively coupled to the voltage regulator controller. The multiple drivers are configured to individually transmit a multiplexed signal on the first signal line to the voltage controller.

In another embodiment, a method includes transmitting a driver address on a signal line. The driver address is configured to identify a first driver of multiple drivers. The method also includes receiving an acknowledgement signal, temperature data, fault data, and parity check data from the first driver on the signal line.

The object and advantages of the embodiments will be realized and achieved at least by the elements, features, and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Figure 1:
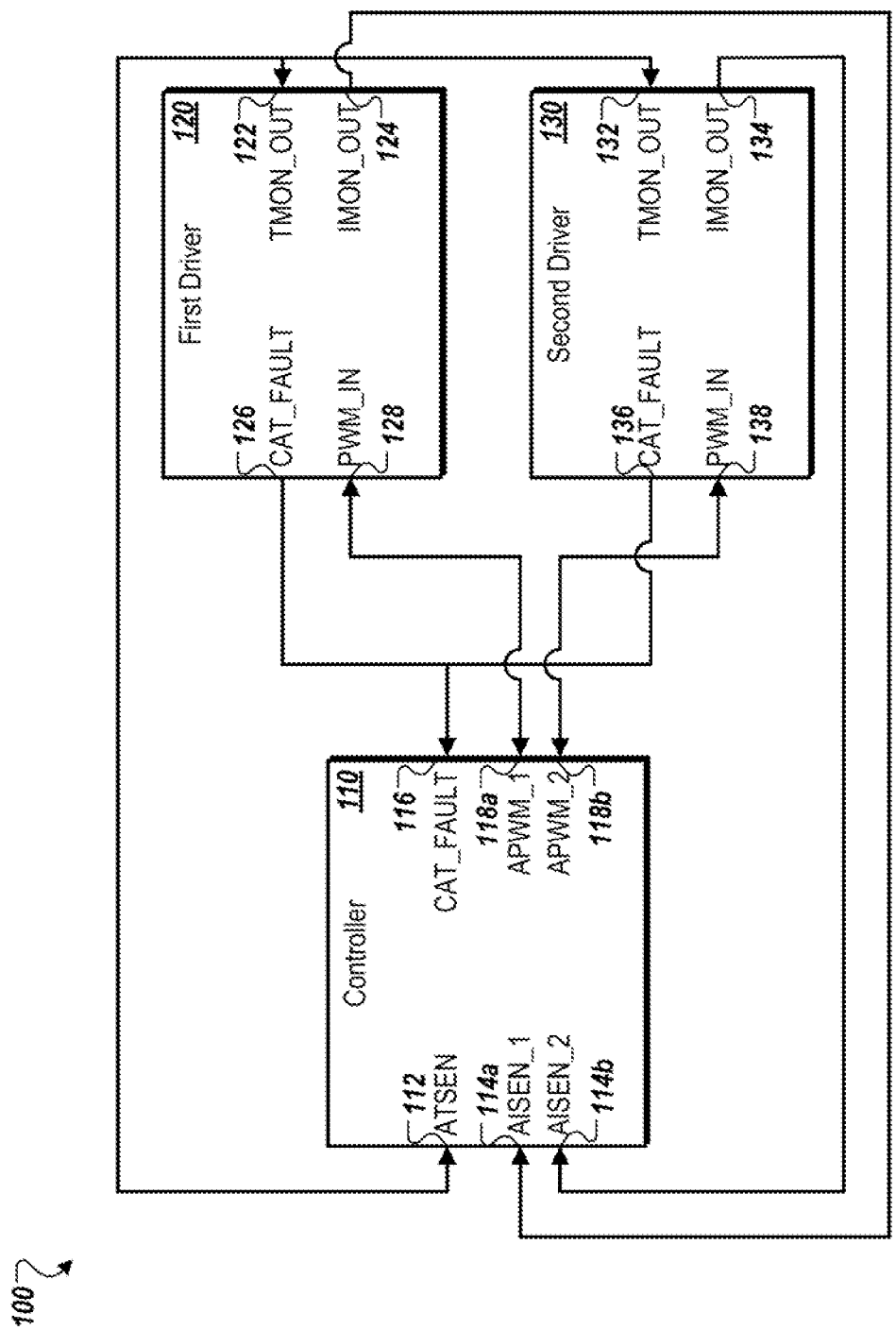
FIG. 1 illustrates an example voltage regulator system.

Some existing voltage regulator controllers may be configured to support a number of voltage rails (e.g., two voltage rails), where each voltage rail may be configured to support a number of phases. For example, an INTEL® VR14 may support up to 12 phases. In some circumstances, each phase may include one or more faults, which may include over current protection (OCP), high side short/control power transistor short detection (HSS), and/or over temperature protection (OTP).

In some circumstances, an interface between a driver and the voltage regulator controller may include support for a single fault pin, which may limit an amount of information that may be transmitted between the driver and the voltage regulator controller. For example, the voltage regulator controller may not be configured or able to distinguish which driver may be experiencing a fault and/or which fault the driver may be experiencing. In some circumstances, the voltage regulator controller may be configured to shut down upon determining a fault, which may reduce the effectiveness of the voltage regulator controller as the voltage regulator controller may shut down in the presence of any fault associated with any driver and/or phase, even if the fault is not a catastrophic fault.

In some circumstances, a sensed current may be transmitted from the driver to the voltage regulator controller as a low-level analog signal. In some circumstances, the transmission of the sensed current by the driver to the voltage regulator controller may be routed along a conductance path on a computer board. Noise may be introduced to the sensed current along the conductance path as the low-level analog signal may be prone to interference. Attempting to limit the introduction of noise to the sensed current may introduce challenges of computer board design as an increase in the number of phases and/or drivers may introduce additional conductance paths, with the potential of noise being introduced along each of the conductance paths. And, as the number of conductance paths increases, techniques to reduce noise along those conductance paths becomes more difficult, both because of scale, and in view of limited space on a circuit board.

Aspects of the present disclosure address these and other shortcomings of prior approaches by enabling the voltage regulator controller to identify a driver experiencing a fault from multiple other drivers. Alternatively, or additionally, the voltage regulator controller may be configured to identify a particular fault associated with a driver. In some circumstances, rather than shutting down, the voltage regulator controller may instead be configured to disable and/or shut down a driver that may be experiencing a fault and maintain operations associated with the other drivers and/or phases.

In some circumstances, one or more embodiments of the present disclosure may be configured to transmit a digitized sensed current from the driver to the voltage regulator controller. The sensed current may be converted to a digital signal by the driver and converted back to an analog signal by the voltage regulator controller. In some circumstances, the digitized sensed current may be less sensitive to noise than the low-level analog signal which may alleviate some difficulty in routing conductance paths from the drivers to the voltage regulator controller on a computer board.

In some embodiments, the present disclosure may include an option to enable and/or disable the above-mentioned solutions such that one or more embodiments may be configured to be operable with legacy voltage regulator controllers and/or drivers.

Embodiments of the present disclosure will be explained with reference to the accompanying drawings.

FIG. 1 illustrates an example voltage regulator system 100 configured for fault communication, in accordance with at least one embodiment described in the present disclosure. In some embodiments, the voltage regulator system 100 may include a controller 110, a first driver 120, and a second driver 130.

The controller 110 may include a temperature sense pin 112, a first current sense pin 114a, a second current sense pin 114b, referred to collectively as current sense pins 114, a controller fault pin 116, a first controller pulse width modulation (PWM) pin 118a, and a second controller PWM pin 118b, referred to collectively as controller PWM pins 118.

The first driver 120 may include a first temperature pin 122, a first current pin 124, a first fault pin 126, and a first PWM pin 128.

The second driver 130 may include a second temperature pin 132, a second current pin 134, a second fault pin 136, and a second PWM pin 138. The first driver 120 and the second driver 130 may include similar components, thus the components of the first driver 120 are generally discussed, unless otherwise specified.

In some embodiments, the controller 110 may be configured to maintain a phase voltage as part of the voltage regulator system 100. The controller 110 may refer to a voltage regulator controller and may be configured to monitor temperature, current, and/or fault data in association with maintaining the phase voltage. In some embodiments, a driver may be associated with a phase voltage. For example, the first driver 120 may be associated with a first phase voltage. Alternatively, or additionally, one or more drivers may be associated with one or more phase voltages. For example, the first driver 120 may be associated with a first voltage and the second driver 130 may be associated with a second voltage that may differ from the first voltage.

In some embodiments, the controller 110 may include one or more pins that may be configured to be coupled to one or more pins associated with one or more drivers, such as the first driver 120 and/or the second driver 130, via one or more signal lines.

In some embodiments, the temperature sense pin 112 may be coupled to one or more temperature pins of one or more drivers, such as the first temperature pin 122 of the first driver 120 and the second temperature pin 132 of the second driver 130, via a single signal line such that the first temperature pin 122 and the second temperature pin 132 may be shorted together. In some embodiments, the controller 110 may be configured to transmit and/or receive data from the first driver 120 and the second driver 130 via a single signal line using the temperature sense pin 112, the first temperature pin 122 and the second temperature pin 132.

Alternatively, or additionally, the first current sense pin 114a may be coupled to the first current pin 124 and the second current sense pin 114b may be coupled to the second current pin 134. In some embodiments, the current sense pins 114 may each be coupled to different drivers such that signal lines associated with the current sense pins 114 may not be shorted and/or shared between drivers, such as the first driver 120 and the second driver 130. In some embodiments, the controller 110 may be configured to implement current loop control and/or average current calculations. In these and other embodiments, the controller 110 may be configured to receive continuous-time current data from the first driver 120 and the second driver 130, such that the signal lines associated with the current sense pins 114 may not be shared and/or shorted between the first current pin 124 and the second current pin 134.

Alternatively, or additionally, the controller fault pin 116 may be coupled to one or more fault pins of one or more drivers, such as the first fault pin 126 of the first driver 120 and the second fault pin 136 of the second driver 130, via a single signal line such that the first fault pin 126 and the second fault pin 136 may be shorted together. In some embodiments, the controller 110 may be configured to receive data from the first driver 120 and the second driver 130 via a single signal line using the controller fault pin 116, the first fault pin 126 and the second fault pin 136.

Alternatively, or additionally, the first controller PWM pin 118a may be coupled to the first PWM pin 128 and the second controller PWM pin 118b may be coupled to the second PWM pin 138. In some embodiments, the controller PWM pins 118 may each be coupled to different drivers such that signal lines associated with the controller PWM pins 118 may not be shorted and/or shared between drivers, such as the first driver 120 and the second driver 130.

In some embodiments, the controller 110 may be configured to perform addressing operations of the first driver 120 and/or the second driver 130. For example, the controller 110 may be configured to determine an address of each driver connected in the voltage regulator system 100. In some embodiments, the controller 110 may be configured to use the controller PWM pins 118 and associated signal lines to perform addressing operations, such as before a startup sequence associated with the controller PWM pins 118. For example, the controller 110 may be configured to perform addressing operations using the controller PWM pins 118 before a nonzero VBOOT voltage ramp up may occur, which may be associated with a startup sequence. In some embodiments, the addressing operations may occur within approximately 2.5 ms from power on of the voltage regulator system 100 to the VBOOT voltage ramp up.

In some embodiments, the controller 110 may be configured to repeat the addressing operations more than one instance. For example, the controller 110 may be configured to perform a first addressing operation, a second addressing operation, and a third addressing operation, each associated with a single driver, such as the first driver 120. Alternatively, or additionally, the controller 110 may be configured to perform more or less than three addressing operations with each driver. In these and other embodiments, the controller 110 may be configured to perform one or more addressing operations with each driver included in the voltage regulator system 100, such as coupled to the controller 110.

In some embodiments, the controller 110 may be configured to include a delay between addressing operations in instances in which more than one addressing operation is included in the voltage regulator system 100. In some embodiments, the more than one addressing operations and the delay may be arranged in view of asynchronous communications between the controller 110 and the first driver 120 and/or the second driver 130. In some embodiments, the controller 110 may include a nonuniform delay between addressing operations. For example, the first addressing operation may be transmitted followed by approximately a 500 us delay, then the second addressing operation followed by approximately a 1000 us delay, and finally the third addressing operation. Alternatively, or additionally, the controller 110 may include a uniform delay between addressing operations. For example, the first addressing operation may be transmitted followed by approximately a 750 us delay, then the second addressing operation followed by approximately a 750 us delay, and finally the third addressing operation. In these and other embodiments, the length of the delay and/or the number of delays may be illustrative only as the length of the delays may be longer or shorter than those described, and the number of delays may be more or less than two.

In some embodiments, the controller 110 may be configured to receive an acknowledgement signal from drivers that receive the addressing operations, such as the first driver 120 and/or the second driver 130. The acknowledgement signal may provide an indication that the driver is connected and/or operational and the acknowledgement signal may be in response to any of the repeated addressing operations. For example, in instances in which the controller 110 receives an acknowledgement signal from the first driver 120 and does not receive an acknowledgement signal from the second driver 130, the controller 110 may register and/or include the first driver 120 in an active driver list and the controller 110 may not register and/or include the second driver 130 in the active driver list. In some embodiments, the controller 110 may reference the active driver list in determining driver addresses to obtain temperature data and fault data.

Following an acknowledgement signal, the signal lines between the controller PWM pins 118 and the first PWM pin 128 and/or the second PWM pin 138 may be configured to transmit PWM signals. For example, after the addressing operations are complete, the controller PWM pins 118 may be configured to drive a high side and a low side metal-oxide-semiconductor field-effect transistor (MOSFET) in the first driver 120 and/or the second driver 130. Additional details regarding the addressing operations may further be discussed relative to FIG. 3 and/or FIG. 4.

In some embodiments, the controller 110 may be configured to send and/or receive a multiplexed signal from the first driver 120 and/or the second driver 130 over a signal line connecting the temperature sense pin 112, the first temperature pin 122, and the second temperature pin 132, respectively. In some embodiments, the multiplexed signal may include at least temperature data and/or fault data. In some embodiments, the first temperature pin 122 and the second temperature pin 132 may be shorted together such that only one of the first driver 120 and the second driver 130 may be configured to transmit data as the multiplexed signal at a time. The controller 110 may be configured to direct an order of communications by the first driver 120 and/or the second driver 130 such that only one driver is configured to communicate between the temperature sense pin 112 and the first temperature pin 122 and/or the second temperature pin 132.

In some embodiments, the controller 110 may receive parity check data along with the temperature data and/or the fault data from a driver, such as the first driver 120. In some embodiments, the parity check data may be associated with the temperature data and/or the fault data and may be used for error checking and/or error correction associated with the temperature data and/or the fault data. In instances in which the controller 110 verifies the parity check data from the first driver 120, the controller 110 may latch the received temperature data and/or fault data from the first driver 120, transmit an end identifier, such as a stop bit, and addresses a next driver, such as the second driver 130.

In some embodiments, the controller 110 may be configured to determine if a driver is no longer connected and/or communicating with the controller 110 during a transmission window associated with the multiplexed signal. For example, in instances in which the controller 110 does not receive a multiplexed signal from the first driver 120 during an allotted transmission window, the controller 110 may update the active driver list to remove the first driver 120 therefrom.

In some embodiments, the first driver 120 may be configured to resynchronize with the controller 110 upon receiving a beginning identifier, such as a start bit. In at least some embodiments, resynchronization may include oversampling data using a base clock. The base clock, for example, may be allowed to vary within a certain parts per million (ppm) (e.g., up to 2500 parts per million). In at least one embodiment, ppm may be indicative of a clock accuracy that may be a result of manufacturing variation of a crystal. Alternatively, or additionally, the first driver 120 may be configured to transmit the temperature data, the fault data, and/or the parity check data after receiving the first driver address from the controller 110 on the signal line configured to transmit the multiplex signals.

Figure 5:
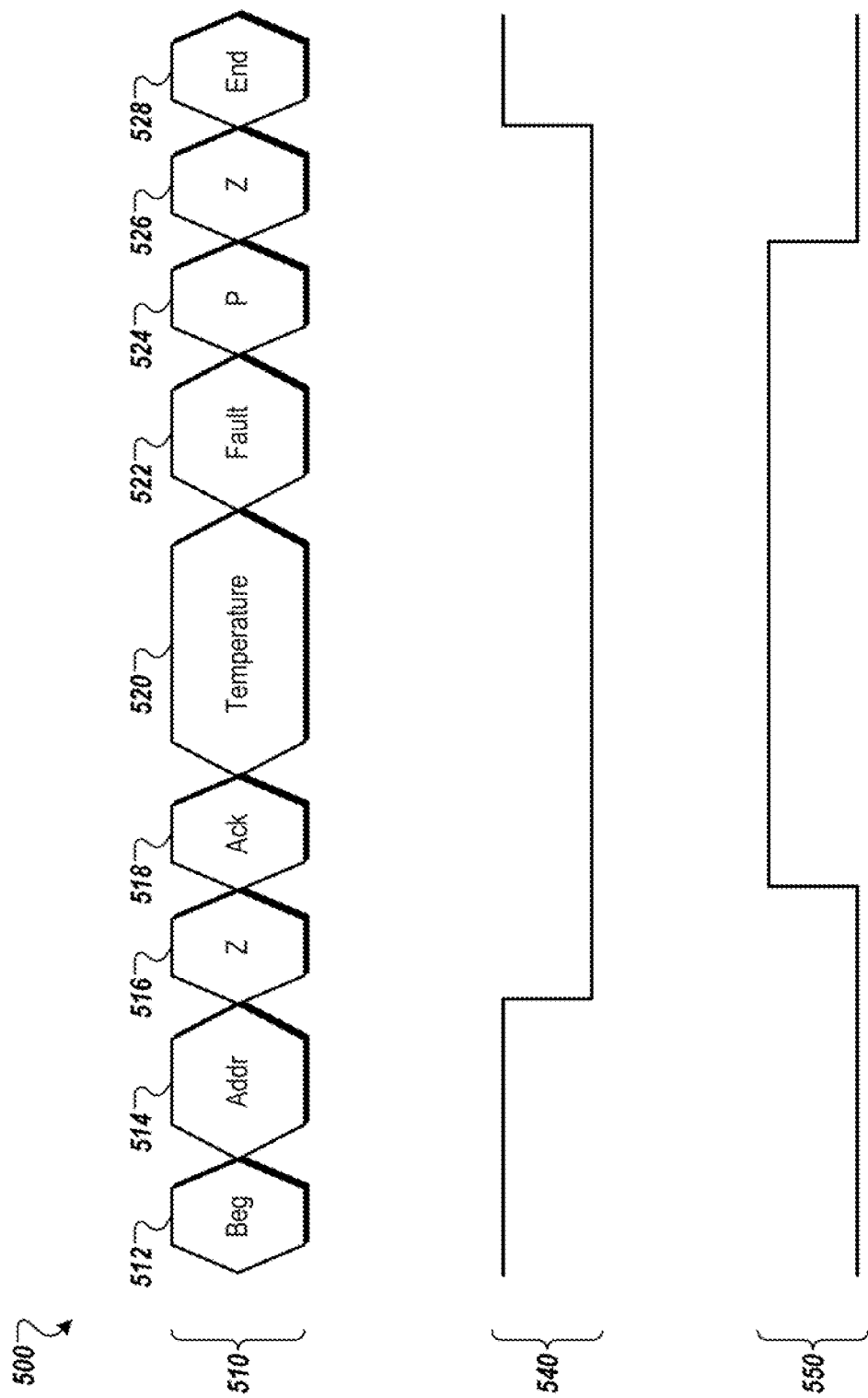
FIG. 5 illustrates another example transmission frame.
Figure 7:
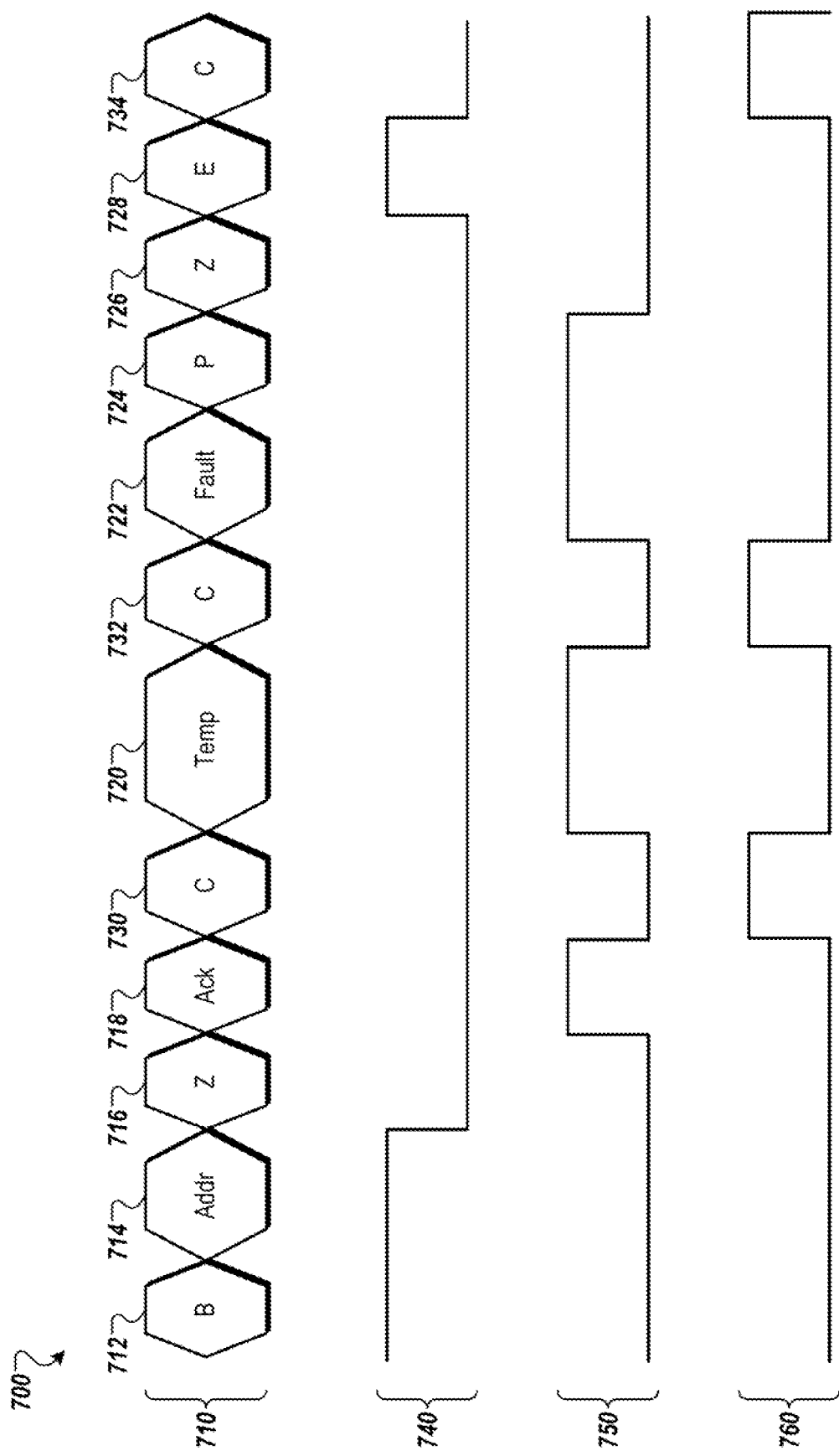
FIG. 7 illustrates another example transmission frame.

In some embodiments, once the controller 110 determines the first driver 120 may transmit data, the first driver 120 may be configured to include an uninterrupted transmission to the controller 110 (e.g., other drivers included in the voltage regulator system 100 may not transmit during the transmission by the first driver 120). For example, FIG. 5 illustrates an example transmission from a driver that includes an acknowledgement signal, temperature data, fault data, and parity check data transmitted without interruption from another driver. Alternatively, or additionally, one or more transmission windows may be provided during a transmission from a driver to the controller 110 such that any driver in the voltage regulator system 100 may transmit data to the controller 110. For example, FIG. 7 illustrates an example transmission from a driver that includes multiple windows during the transmission in which a second driver makes a transmission to the controller. In some embodiments, the one or more transmission windows may provide a driver a window to report an issue and reduce a latency associated with the voltage regulator system 100 at least with regard to fault processing. In at least one embodiment, the issue may include a catastrophic fault or issue that may warrant an additional window to reduce latency in reporting.

Additional details regarding the transmission of the multiplexed signals between the controller 110 and the first driver 120 and/or the second driver 130 may further be discussed relative to FIG. 5 through FIG. 8.

In these and other embodiments, the controller 110 may be configured to determine a specific fault that may be experienced by a driver, such as the first driver 120 and/or the second driver 130 by using the temperature data and fault data transmitted from the first driver 120 and/or the second driver 130. In instances in which the first driver 120 may be experiencing a fault, the controller 110 may be configured to address the fault with the first driver 120 (e.g., shut down operation of the first driver 120) and the controller 110 may redirect resources to other operational drivers, such as the second driver 130. In some embodiments, the response by the controller 110 may improve the efficiency of the voltage regulator system 100 by reducing full shutdowns of the voltage regulator system 100 when a shutdown of an individual driver may be sufficient to address a fault associated with the individual driver.

In some embodiments, the first driver 120 and the second driver 130 may be configured to transmit current data to the controller 110 on unique signal lines. For example, the first current pin 124 may be coupled to the first current sense pin 114a and the second current pin 134 may be coupled to the second current sense pin 114b. In some embodiments, the current data may be continuously transmitted between the first driver 120 and the controller 110 and the second driver 130 and the controller 110. In some embodiments, the controller 110 may be configured to provide current loop control which may use the continuously transmitted current data. Alternatively, or additionally, the controller 110 may be configured to provide average current data which may use the continuously transmitted current data.

In some embodiments, the first driver 120 may be configured to obtain current data associated with a phase with which the first driver 120 is associated. In some embodiments, the current data obtained by the first driver 120 may be an analog signal. The first driver 120 may be configured to convert the current data from an analog signal to a digital signal prior to transmission to the controller 110. In some embodiments, the controller 110 may be configured to convert the current data from a digital signal to an analog signal upon reception of a digital current signal. Additional details regarding the current data and/or the conversion between an analog signal and a digital signal may further be discussed relative to FIG. 2B.

Modifications, additions, or omissions may be made to the voltage regulator system 100 without departing from the scope of the present disclosure. For example, in instances in which the controller 110 and the first driver 120 and the second driver 130 may not include a synchronized clock, the controller 110, the first driver 120, and the second driver 130 may each be configured to include an overclocked asynchronous communication protocol. Alternatively, or additionally, the controller 110 and/or the first driver 120 and the second driver 130 may each include a ring oscillator that may include a first frequency and/or a difference. For example, the first frequency may be approximately 50 MHz and the difference may be approximately 2500 ppm. In at least some embodiments, the difference may be approximately 10 ppm, or 100 ppm, for example.

In some embodiments, upon powering up the voltage regulator system 100, power may first be applied to the first driver 120 then to the controller 110 following power to the first driver 120. Alternatively, or additionally, power may be applied to the controller 110 and the first driver 120 in any order, or at substantially the same time. Other modifications, additions, or omissions may be made to the voltage regulator system 100 without departing from the scope of the present disclosure. For example, in some embodiments, the voltage regulator system 100 may include any number of other components that may not be explicitly illustrated or described.

Figure 2A:
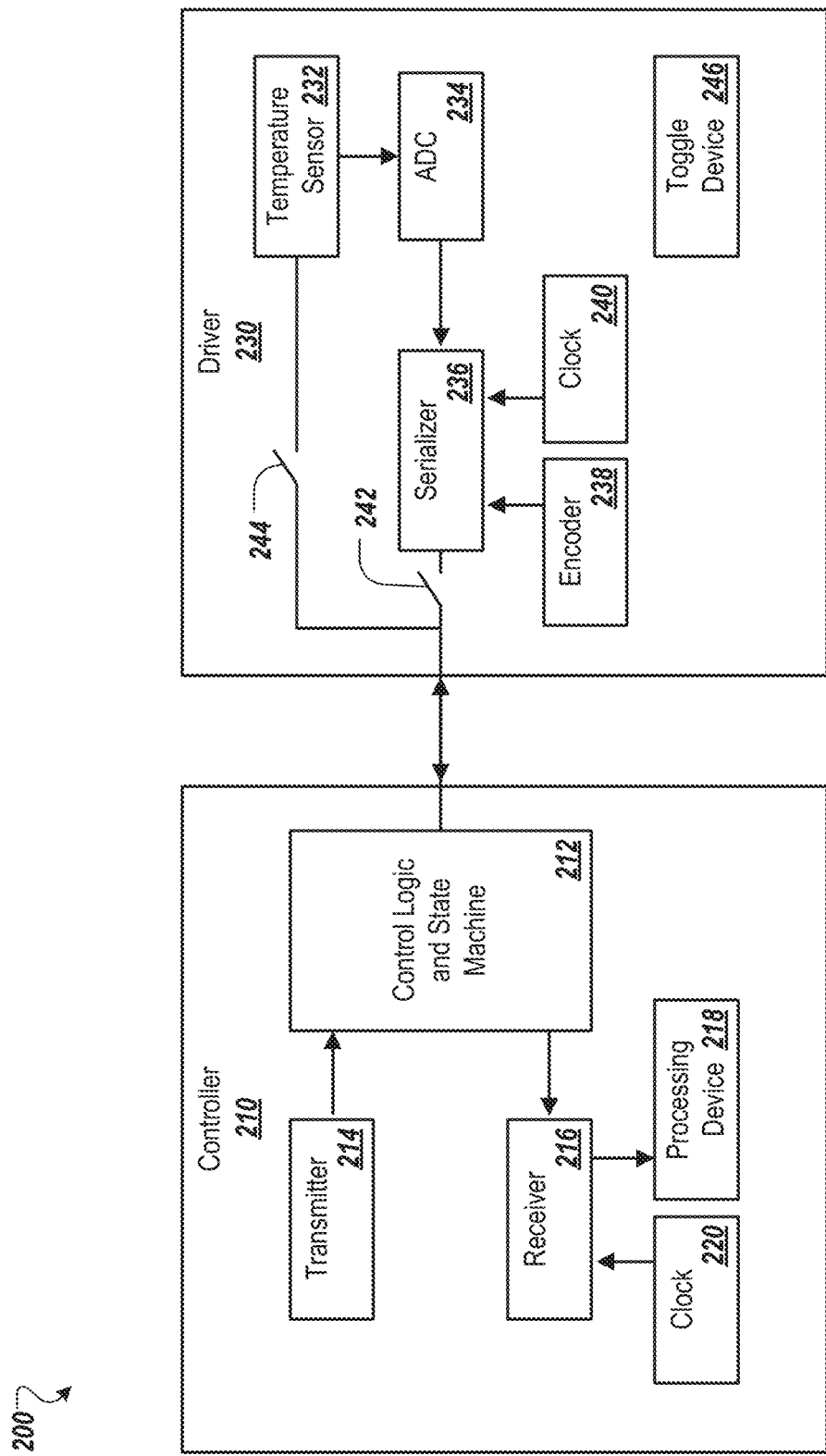
FIG. 2A illustrates an aspect of an example voltage regulator system.

FIG. 2A illustrates an aspect of an example voltage regulator system 200 configured for transmitting temperature data and fault data, in accordance with at least one embodiment described in the present disclosure. In some embodiments, the voltage regulator system 200 may include a controller 210 and a driver 230. The controller 210 may include a state machine 212, a transmitter 214, a receiver 216, a processing device 218, and a controller clock 220. The driver 230 may include a temperature sensor 232, an analog to digital converter (ADC) 234, a serializer 236, a fault encoder 238, a driver clock 240, a first switch 242, and a second switch 244.

In some embodiments, the controller 210 may be the same or similar as the controller 110 of FIG. 1 and/or may be configured to perform some or all of the functions as described relative to the controller 110 of FIG. 1. Alternatively, or additionally, the driver 230 may be the same or similar as the first driver 120 and/or the second driver 130 of FIG. 1 and/or may be configured to perform some or all of the functions as described relative to the first driver 120 and/or the second driver 130 of FIG. 1.

In some embodiments, the voltage regulator system 200 may be arranged to illustrate the elements configured to facilitate temperature data and fault data transmissions between the controller 210 and the driver 230. For example, the voltage regulator system 200 may illustrate elements of the controller 210 and the driver 230 that may contribute to transmissions between a temperature sense pin of the controller 210 and a temperature pin of the driver 230.

In some embodiments, the state machine 212 may be configured to arrange transmissions by the controller 210 and/or handle transmissions from one or more drivers, such as the driver 230. Alternatively, or additionally, the state machine 212 may be configured to interface with the signal line transmitting the temperature data and fault data associated with a driver.

In some embodiments, the transmitter 214 may be configured to generate a transmission to be sent to a driver, such as the driver 230. In some embodiments, the transmitter 214 may be configured to send a transmission as a serial data stream. In some embodiments, the transmitter 214 may be configured to transmit an address, a beginning identifier, and/or an ending identifier. In some embodiments, the state machine 212 may be configured to determine a specific driver the transmission may be directed to, and the state machine 212 may be configured to use the address from the transmitter 214 to determine the addressed driver.

In some embodiments, the receiver 216 may be configured to receive a transmission from a driver, such as the driver 230. In some embodiments, the receiver 216 may use input from the controller clock 220 which may contribute to the receiver 216 being synchronized in the voltage regulator system 200. In some embodiments, the controller clock 220 may include a ring oscillator. In some embodiments, the ring oscillator may include a frequency of approximately 50 MHz and a difference of approximately 2500 ppm.

In some embodiments, the processing device 218 may be configured to handle and/or store received temperature data and/or fault data that may be associated with the drivers included in the voltage regulator system 200, such as the driver 230. In some embodiments, the processing device 218 may be configured to determine instances in which a driver may discontinue operations due to an abnormal temperature or a detected fault.

In some embodiments, the temperature sensor 232 may be configured to obtain a temperature associated with the driver 230. In some embodiments, the temperature obtained by the temperature sensor 232 may include an analog signal. In some embodiments, the output of the temperature sensor 232 may be input to the ADC 234 which may convert the analog temperature signal to a digital temperature signal. In some embodiments, the serializer 236 may be configured to prepare the digital temperature signal to be transmitted from the driver 230 to the controller 210 as a serial digital temperature signal. In some embodiments, the serializer 236 may be configured to arrange the temperature data and/or the fault data into a determined packet size, such as illustrated in FIG. 5 and FIG. 7. In some embodiments, transmitting the temperature signal as a digital signal may reduce losses due to noise during the transmission from the driver 230 to the controller 210.

In some embodiments, the fault encoder 238 may be configured to generate fault data associated with the driver 230. For example, in instances in which the driver 230 may be experiencing a fault, the fault encoder 238 may be configured to generate a report of the fault. In some embodiments, the fault data output by the fault encoder 238 may be input to the serializer 236 in preparation to be sent from the driver 230 to the controller 210.

In some embodiments, the serializer 236 may use input from the driver clock 240 which may contribute to the serializer 236 being synchronized in the voltage regulator system 200. In some embodiments, the driver clock 240 may include a ring oscillator. In some embodiments, the ring oscillator may include a frequency of approximately 50 MHz and a difference of approximately 2500 ppm.

In some embodiments, the first switch 242 and the second switch 244 may be configured to enable and/or disable the transmission of digitized temperature data and fault data from the driver 230 to the controller 210. For example, in instances in which the first switch 242 is closed and the second switch 244 is open, the temperature data obtained by the temperature sensor 232 may be converted to a digital temperature signal and serially transmitted from the driver 230 to the controller 210 and the fault data obtained by the fault encoder 238 may be serially transmitted from the driver 230 to the controller 210. In another example, in instances in which the first switch 242 is open and the second switch 244 is closed, the temperature data obtained by the temperature sensor 232 may be transmitted from the driver 230 to the controller 210 as an analog temperature signal and the fault data may not be transmitted on the signal line. In these and other embodiments, the first switch 242 and the second switch 244 may be configured to operate opposite of each other. For example, in instances in which the first switch 242 is open, the second switch 244 may be closed, and vice versa.

In some embodiments, operation of the first switch 242 and the second switch 244 may be controlled by the controller 210. For example, the state machine 212 and/or the processing device 218 may determine whether the temperature data may be digitized and may direct the states of the first switch 242 and the second switch 244 accordingly. Alternatively, or additionally, a toggle device 246 may be included in the driver 230 which may direct the states of the first switch 242 and the second switch 244. For example, a non-volatile memory (NVM) 246 may be included in the driver 230 that may be configured to determine and/or set the state of the first switch 242 and the second switch 244. For example, in instances in which the driver 230 is coupled to a controller that is not configured to receive digital temperature data, the NVM 246 in the driver 230 may arrange the state of the switches such that analog temperature data is transmitted from the driver 230.

Figure 2B:
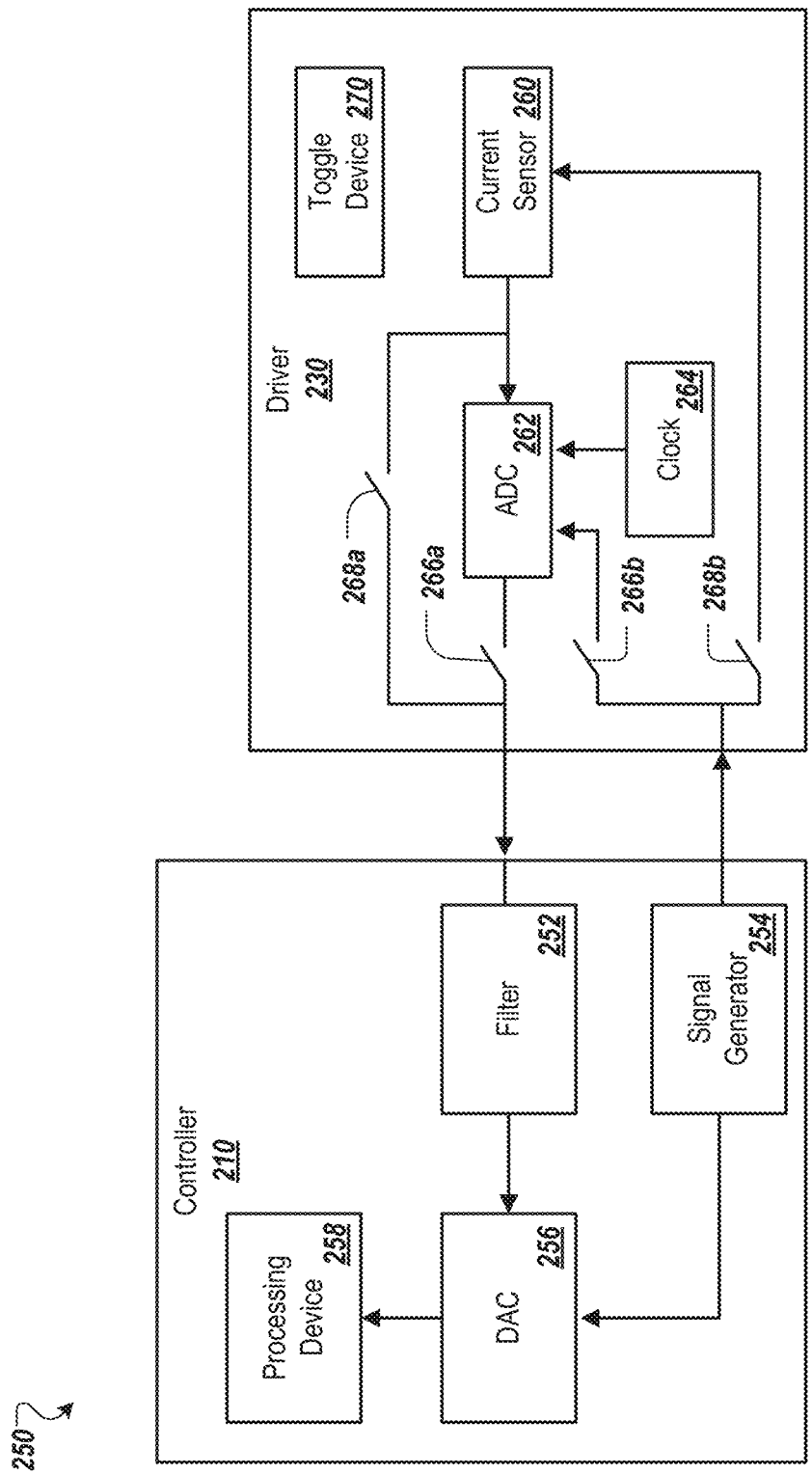
FIG. 2B illustrates another aspect of an example voltage regulator system.

FIG. 2B illustrates another aspect of an example voltage regulator system 250 configured for transmitting current data, in accordance with at least one embodiment described in the present disclosure. In some embodiments, the voltage regulator system 200 may include a controller 210 and a driver 230. The controller 210 may include a filter 252, a signal generator 254, a digital to analog converter (DAC) 256, and a processing device 258. The driver 230 may include a current sensor 260, an analog to digital converter (ADC) 262, a clock 264, a first switch 266a, a second switch 266b, a third switch 268a, and a fourth switch 268b.

In some embodiments, the voltage regulator system 250 may be arranged to illustrate the elements configured to facilitate current data transmissions between the controller 210 and the driver 230. For example, the voltage regulator system 250 may illustrate elements of the controller 210 and the driver 230 that may contribute to transmissions between a current sense pin of the controller 210 and a current pin of the driver 230.

In some embodiments, the signal generator 254 may be configured to generate a current signal that may be input to the DAC 256 and/or the current sensor 260. In some embodiments, the signal generator 254 may generate a reference signal that may be used by the DAC 256 and/or the current sensor 260. In some embodiments, the reference signal may include a reference voltage.

In some embodiments, the filter 252 may be configured to filter the received current signal from the driver 230. In some embodiments, the filter 252 may include a decimation filter. In some embodiments, the filter 252 may be configured to filter a digital current signal from the driver 230. Alternatively, or additionally, the filter 252 may be configured to filter an analog current signal from the driver 230.

In some embodiments, the output from the filter 252 may be input to the DAC 256. The DAC 256 may be configured to generate an analog signal to be input to the processing device 258. In some embodiments, the DAC 256 may receive the reference signal from the signal generator 254 and the DAC 256 may use the reference signal in conjunction with converting a digital current signal to an analog current signal.

In some embodiments, the processing device 258 may receive the analog current signal from the DAC 256. In some embodiments, the processing device 258 may be configured to determine an average current associated with the driver 230. Alternatively, or additionally, the processing device 258 may be configured to provide a current loop control for the voltage regulator system 250.

In some embodiments, the current sensor 260 may be configured to obtain a current associated with the driver 230. In some embodiments, the current obtained by the current sensor 260 may include an analog signal. In some embodiments, the output of the current sensor 260 may be input to the ADC 262 which may convert the analog current signal to a digital current signal. In some embodiments, the ADC 262 may include a delta-sigma modulator such that the ADC 262 is a delta-sigma analog to digital converter, which may be configured to encode the analog current signal into the digital current signal. In some embodiments, transmitting the current signal as a digital signal may reduce losses due to noise during the transmission from the driver 230 to the controller 210.

In some embodiments, the ADC 262 may use input from the clock 264 which may contribute to the ADC 262 being synchronized in the voltage regulator system 250. In some embodiments, the clock 264 may include a ring oscillator. In some embodiments, the ring oscillator may include a frequency of approximately 50 MHz and a difference of approximately 2500 ppm.

In some embodiments, the first switch 266a, the second switch 266b, the third switch 268a, and the fourth switch 268b may be configured to enable and/or disable the transmission of digitized current data from the driver 230 to the controller 210. For example, in instances in which the first switch 266a and the second switch 266b are closed and the third switch 268a and the fourth switch 268b are open, the current data obtained by the current sensor 260 may be converted to a digital current signal and transmitted from the driver 230 to the controller 210. In another example, in instances in which the first switch 266a and the second switch 266b are open and the third switch 268a and the fourth switch 268b are close, the current data obtained by the current sensor 260 may be transmitted from the driver 230 to the controller 210 as an analog current signal on the signal line.

In these and other embodiments, the first switch 266a and the second switch 266b may be configured to operate in unison with each other and the third switch 268a and the fourth switch 268b may be configured to operate in unison with each other. For example, in instances in which the first switch 266a is open, the second switch 266b may be open. Similarly, in instances in which the third switch 268a is closed, the fourth switch 268b may be closed. In some embodiments, the first switch 266a and the second switch 266b may be configured to operate opposite of the third switch 268a and the fourth switch 268b. For example, in instances in which the first switch 266a and the second switch 266b are open, the third switch 268a and the fourth switch 268b may be closed, and vice versa.

In some embodiments, operation of the first switch 266a, the second switch 266b, the third switch 268a, and the fourth switch 268b may be the same or similar as the operation of the first switch 242 and the second switch 244 of FIG. 2A. For example, the operation of the first switch 266a, the second switch 266b, the third switch 268a, and the fourth switch 268b may be controlled by the state machine 212 and/or the processing device 218 of FIG. 2A. Alternatively, or additionally, a toggle device 270 (e.g., the NVM) may be configured to determine and/or set the state of the first switch 266a, the second switch 266b, the third switch 268a, and the fourth switch 268b. In these and other embodiments, the first switch 266a and the second switch 266b may be configured to operate in unison with the first switch 242 of FIG. 2A. Alternatively, or additionally, the third switch 268a and the fourth switch 268b may be configured to operate in unison with the second switch 244 of FIG. 2A.

Modifications, additions, or omissions may be made to the voltage regulator system 200 or the voltage regulator system 250 without departing from the scope of the present disclosure. For example, in some embodiments, the voltage regulator system 200 or the voltage regulator system 250 may include any number of other components that may not be explicitly illustrated or described.

Figure 3:
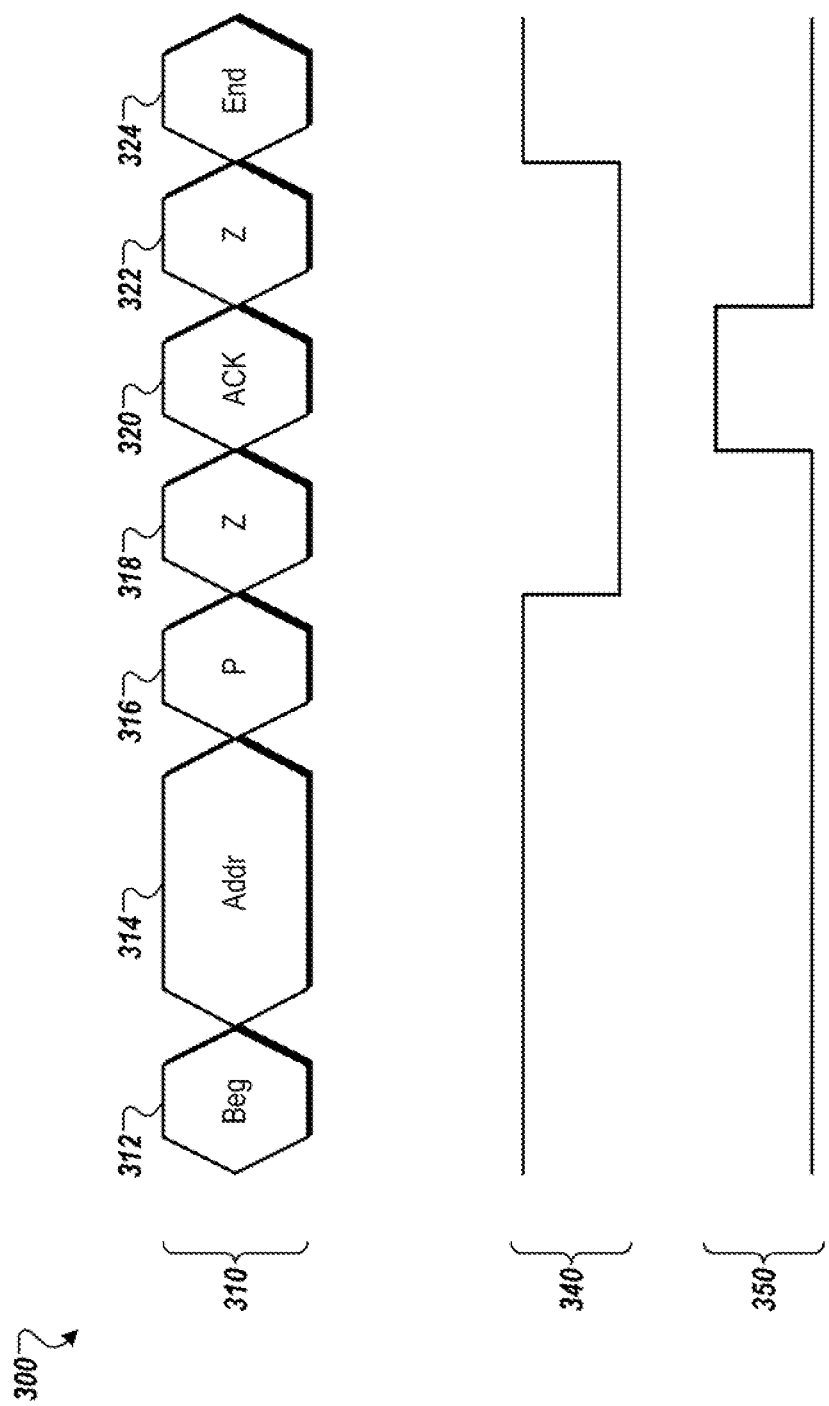
FIG. 3 illustrates an example transmission frame.

FIG. 3 illustrates an example transmission frame 300 configured for driver addressing operations and may include driver address enumeration, in accordance with at least one embodiment described in the present disclosure. In some embodiments, the transmission frame 300 may include a header definition 310, a controller response 340, and a driver response 350. The header definition 310 may include a begin identifier 312, a driver address 314, parity check data 316, a first window 318, an acknowledgement signal 320, a second window 322, and an end identifier 324.

In some embodiments, the transmission frame 300 may be used by a controller attempting to determine whether one or more drivers may be present in a voltage regulator system. In some embodiments, the transmission frame 300 may be used in conjunction with one or more controller PWM pins, such as the controller PWM pins 118 of FIG. 1 and one or more driver PWM pins, such as the first PWM pin 128 and/or the second PWM pin 138 of FIG. 1 and may be configured to be transmitted over one or more signal line, as described herein.

As illustrated, the header definition 310 may be arranged in an order beginning with the begin identifier 312. In some embodiments, the begin identifier 312 may include a single bit having the value of zero which may indicate the addressing operation is beginning. Alternatively, or additionally, the begin identifier 312 may include more than one bit and may include a value other than zero to indicate the addressing operation is beginning.

In some embodiments, following the begin identifier 312, the header definition 310 may include the driver address 314. In some embodiments, the driver address 314 may include an address for a specific driver included in the voltage regulator system. In some embodiments, the driver address 314 may include four bits. Alternatively, or additionally, the number of bits included in the driver address 314 may be more or less, such as 8 bits or 16 bits, or 32 bits, or 64 bits, and/or may depend on the number of drivers included in the voltage regulator system.

In some embodiments, following the driver address 314, the header definition 310 may include the parity check data 316. In some embodiments, the parity check data 316 may include data associated with an evaluation of the integrity of the bus (e.g., signal line) over which the driver address 314 was transmitted.

In some embodiments, following the parity check data 316, the header definition 310 may include the first window 318. In some embodiments, the first window 318 may include a number of bits which values may not matter. For example, the first window 318 may include two bits where both bits may be zero. Alternatively, or additionally, the number of bits included in the first window 318 may be more or less than two and may include values other than zero.

In some embodiments, following the first window 318, the header definition 310 may include the acknowledgement signal 320. In some embodiments, the acknowledgement signal 320 may include data indicating a driver is configured to communicate with the controller.

In some embodiments, following the acknowledgement signal 320, the header definition 310 may include the second window 322. In some embodiments, the second window 322 may be the same or similar as the first window 318. Alternatively, or additionally, the second window 322 may include a different number of bits and/or different values for the bits than the first window 318. In these and other embodiments, the first window 318 and the second window 322 may be configured to allow a transition between transmitting devices. For example, in instances in which the controller is transmitting, the first window 318 may provide a transition period such that the driver may begin transmitting. Alternatively, or additionally, in instances in which the driver is transmitting, the second window 322 may provide a transition period such that the controller may begin transmitting.

In some embodiments, following the second window 322, the header definition 310 may include the end identifier 324.

In some embodiments, the end identifier 324 may include a single bit having the value of one which may indicate the addressing operation is ending. Alternatively, or additionally, the end identifier 324 may include more than one bit and may include a value other than one to indicate the addressing operation is ending.

In some embodiments, the controller response 340 may provide a visual indication of periods of time in which the controller is transmitting and/or the substance of the controller transmissions. Alternatively, or additionally, the driver response 350 may provide a visual indication of periods of time in which the driver is transmitting and/or the substance of the driver transmissions. For example, the controller response 340 may be high and the driver response 350 may be low during the begin identifier 312, the driver address 314, and the parity check data 316 which may indicate the controller is transmitting the begin identifier 312, the driver address 314, and the parity check data 316 to the driver.

Both the controller response 340 and the driver response 350 may be low during the first window 318 and the second window 322, which may help prevent overlap between transmitted signals. The controller response 340 may be low and the driver response 350 may be high during the acknowledgement signal 320, which may indicate the driver is transmitting an acknowledgement signal in response to earlier transmissions by the controller to the driver. In some embodiments, the controller response 340 may be high and the driver response 350 may be low during the end identifier 324, which may indicate the controller is ending transmissions to the driver.

In some embodiments, the controller may be configured to repeat transmissions to a driver until the driver responds with an acknowledgement signal. In some embodiments, the controller may limit the number of repeat transmissions to a limit, such as three transmissions. In these and other embodiments, in instances in which the controller receives an acknowledgement signal from the driver, an active driver list may be updated with the address associated with the driver. Alternatively, or additionally, in instances in which the controller fails to receive an acknowledgement signal from the driver, the address associated with the driver may be removed from the active driver list.

In some embodiments, the controller may be configured to set a controller complete flag upon completion of the addressing operations (e.g., an acknowledgement signal received from a driver, or the addressing operation attempted a threshold number of times without an acknowledgement signal received). The controller complete flag may provide an indication to the controller that PWM signals may be transmitted over the signal line previously used for the addressing operations. Alternatively, or additionally, the driver may be configured to set a driver complete flag upon completion of the addressing operations, which may provide an indication to the driver that PWM signals may be transmitted over the signal line previously used for the addressing operations.

Modifications, additions, or omissions may be made to the transmission frame 300 without departing from the scope of the present disclosure. For example, in some embodiments, the transmission frame 300 may include any number of other components that may not be explicitly illustrated or described.

Figure 4:
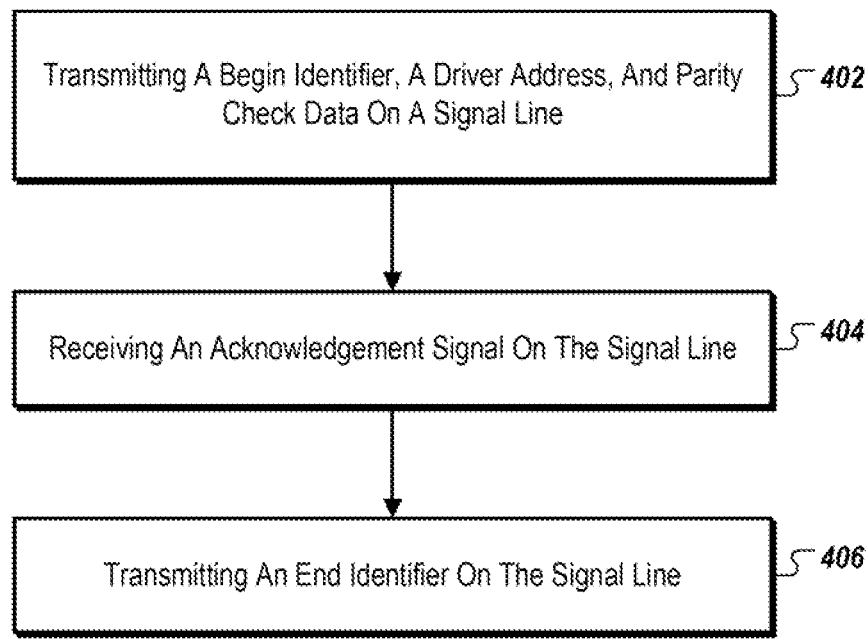
FIG. 4 illustrates a flowchart of an example method for fault communication in voltage regulator systems.

FIG. 4 illustrates a flowchart of an example method 400 for fault communication in voltage regulator systems, in accordance with at least one embodiment described in the present disclosure.

Figure 9:
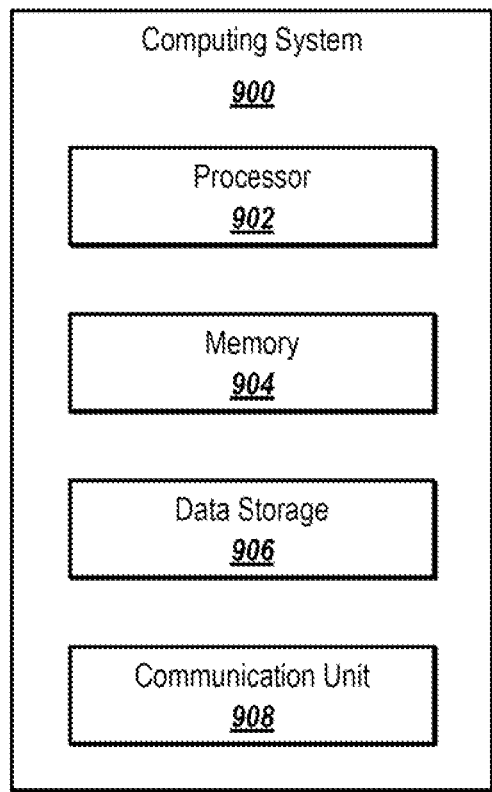
FIG. 9 illustrates an example computing system that may be used for fault communication in voltage regulator systems.

The method 400 may be performed by processing logic that may include hardware (circuitry, dedicated logic, etc.), software (such as is run on a computer system or a dedicated machine), or a combination of both, which processing logic may be included in the controller 110 of FIG. 1, the computing system 900 of FIG. 9, or another device, combination of devices, or systems.

For simplicity of explanation, methods described herein are depicted and described as a series of acts. However, acts in accordance with this disclosure may occur in various orders and/or concurrently, and with other acts not presented and described herein. Further, not all illustrated acts may be used to implement the methods in accordance with the disclosed subject matter. In addition, those skilled in the art will understand and appreciate that the methods may alternatively be represented as a series of interrelated states via a state diagram or events. Additionally, the methods disclosed in this specification are capable of being stored on an article of manufacture, such as a non-transitory computer-readable medium, to facilitate transporting and transferring such methods to computing devices. The term article of manufacture, as used herein, is intended to encompass a computer program accessible from any computer-readable device or storage media. Although illustrated as discrete blocks, various blocks may be divided into additional blocks, combined into fewer blocks, or eliminated, depending on the desired implementation.

The method 400 may begin at block 402, where the processing logic may transmit a begin identifier, a driver address, and parity check data on a signal line. In some embodiments, the transmission of the begin identifier, the driver address, and the parity check data may be to one driver in a voltage regulator system. In instances in which more than one driver is in the voltage regulator system, each driver may include an associated signal line such that the transmissions may overlap and/or occur in parallel.

At block 404, the processing logic may receive an acknowledgement signal on the signal line. In some embodiments, upon receiving the acknowledgement signal, the processing logic may be configured to include a driver associated with the driver address to an active driver list.

At block 406, the processing logic may transmit an end identifier on the signal line. In some embodiments, in instances in which the acknowledgement signal is not received, the processing logic may be configured to repeat the transmissions one or more times until an acknowledgement signal is received. Alternatively, or additionally, the processing logic may be configured to repeat the transmissions a threshold number of times before determining no acknowledgement signal may be received.

Modifications, additions, or omissions may be made to the method 400 without departing from the scope of the present disclosure. For example, the method 400 may include one or more waiting periods before or after receiving the acknowledgement signal in block 404. In some embodiments, the one or more waiting periods may be configured to reduce overlap between transmissions such that the likelihood of losing or corrupting data may be reduced.

FIG. 5 illustrates another example transmission frame 500 configured for temperature data and fault data transmissions on a signal line, such as for temperature and fault communication, in accordance with at least one embodiment described in the present disclosure. In some embodiments, the transmission frame 500 may include a header definition 510, a controller response 540, and a driver response 550. The header definition 510 may include a begin identifier 512, a driver address 514, a first window 516, an acknowledgement signal 518, temperature data 520, fault data 522, parity check data 524, a second window 526, and an end identifier 528.

In some embodiments, the transmission frame 500 may be used by a controller and driver in a voltage regulator system to transmit temperature data and fault data from the driver to the controller over a signal line. In some embodiments, the transmission frame 500 may be used in conjunction with a controller temperature pin, such as the temperature sense pin 112 of FIG. 1 and one or more driver temperature pins, such as the first temperature pin 122 and/or the second temperature pin 132 of FIG. 1 and may be configured to be transmitted over a signal line, as described herein.

In some embodiments, one or more elements of the header definition 510 may be the same or similar as one or more elements of the header definition 310 of FIG. 3. For example, the begin identifier 512, the driver address 514, the first window 516, the acknowledgement signal 518, the second window 526, and the end identifier 528 may be the same as the begin identifier 312, a driver address 314, the first window 318, the acknowledgement signal 320, the second window 322, and the end identifier 324, respectively.

In some embodiments, following the acknowledgement signal 518, the header definition 510 may include the temperature data 520. In some embodiments, the temperature data 520 may include temperature data obtained by the driver. In some embodiments, the temperature data 520 may include eight bits. Alternatively, or additionally, the number of bits included in the temperature data 520 may be more or less and/or may depend on an accuracy or an amount of the temperature data to be transmitted.

In some embodiments, following the temperature data 520, the header definition 510 may include the fault data 522. In some embodiments, the fault data 522 may include fault data obtained by the driver. In some embodiments, the fault data 522 may include four bits. Alternatively, or additionally, the number of bits included in the fault data 522 may be more or less and/or may depend on a number of faults reportable by the driver.

In some embodiments, following the fault data 522, the header definition 510 may include the parity check data 524. In some embodiments, the parity check data 524 may include data associated with an evaluation of the integrity of the temperature data and/or fault data.

In some embodiments, the controller response 540 may provide a visual indication of periods of time in which the controller is transmitting and/or the substance of the controller transmissions. Alternatively, or additionally, the driver response 550 may provide a visual indication of periods of time in which the driver is transmitting and/or the substance of the driver transmissions. For example, the controller response 540 may be high and the driver response 550 may be low during the begin identifier 512, and the driver address 514 which may indicate the controller is transmitting the begin identifier 512, and the driver address 514.

Both the controller response 540 and the driver response 550 may be low during the first window 516 and the second window 526, which may help prevent overlap between transmitted signals between the controller and the driver. The controller response 540 may be low and the driver response 550 may be high during the acknowledgement signal 518, the temperature data 520, the fault data 522, and the parity check data 524, which may indicate the driver is transmitting an acknowledgement signal in response to earlier transmissions by the controller to the driver, temperature data, fault data, and parity check data. In some embodiments, the controller response 540 may be high and the driver response 550 may be low during the end identifier 528, which may indicate the controller is ending transmissions to the driver.

In instances in which more than one driver is included in the voltage regulator system and configured to transmit temperature data and fault data on the signal line, a driver response may be low during transmissions by the controller and/or during transmissions as indicated by the driver response 550. In some embodiments, the driver associated with the driver address 514 may be configured to transmit on the signal line until a new driver address 514 is transmitted by the controller. For example, in instances in which there are three drivers and the controller transmits the driver address 514 of the first driver, the second driver and the third driver may not transmit on the signal line until the driver address 514 associated with the second driver or the third driver is transmitted by the controller.

Figure 8:
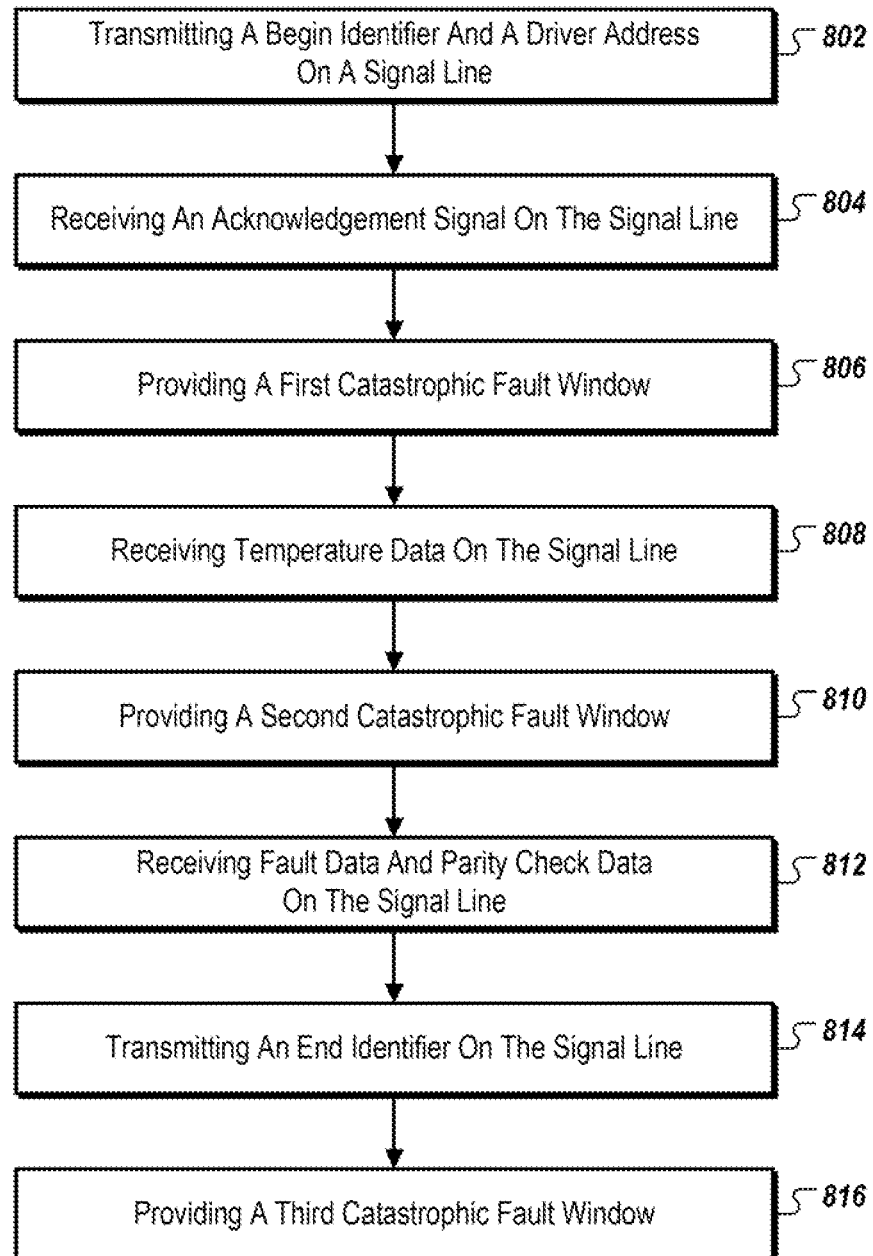
FIG. 8 illustrates a flowchart of another example method for fault communication in voltage regulator systems.

In some embodiments, limiting a driver from transmitting until the associated driver address is transmitted may introduce latency in the voltage regulator system. Referring to the previous example, in instances in which the third driver experiences a fault, the third driver may wait until the first driver and the second driver both transmit before transmitting the fault information, which latency may cause additional problems to the voltage regulator system and/or waste resources. FIGS. 7 and 8 are directed to addressing the above example.

Modifications, additions, or omissions may be made to the transmission frame 500 without departing from the scope of the present disclosure. For example, in some embodiments, the transmission frame 500 may include any number of other components that may not be explicitly illustrated or described.

Figure 6:
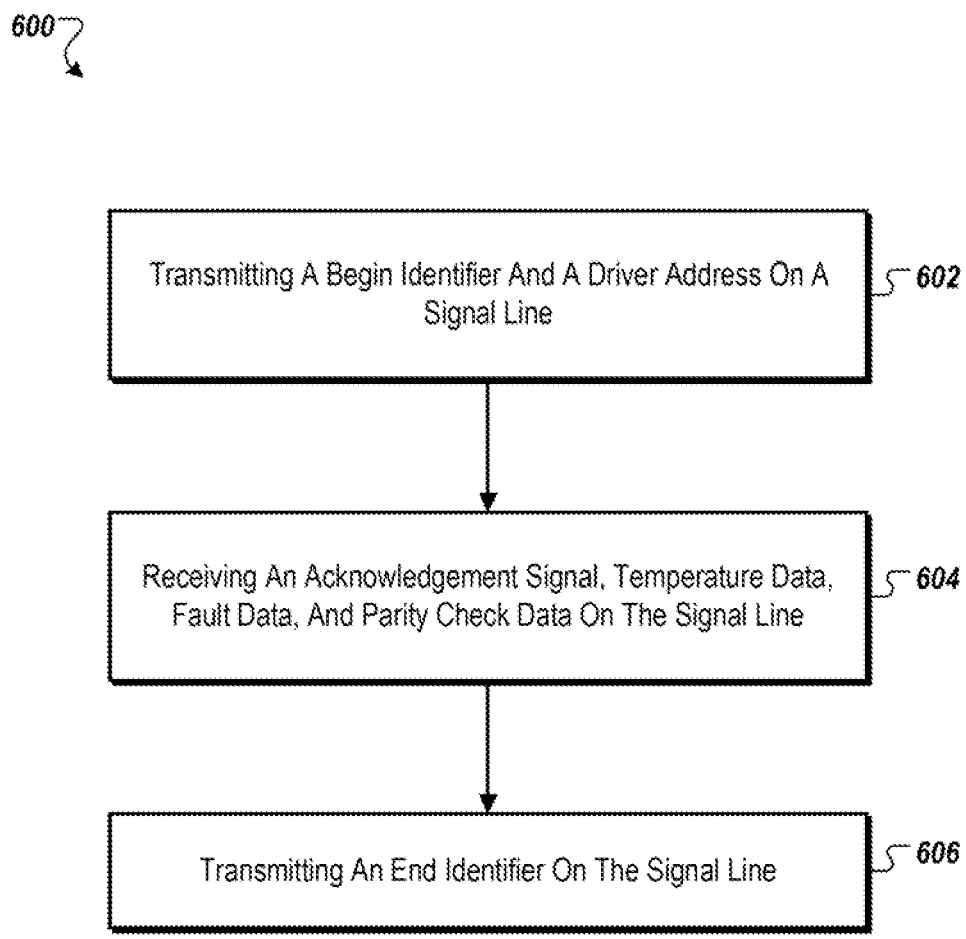
FIG. 6 illustrates a flowchart of another example method for fault communication in voltage regulator systems.

FIG. 6 illustrates a flowchart of another example method 600 for fault communication in voltage regulator systems, in accordance with at least one embodiment described in the present disclosure.

The method 600 may be performed by processing logic that may include hardware (circuitry, dedicated logic, etc.), software (such as is run on a computer system or a dedicated machine), or a combination of both, which processing logic may be included in the controller 110 of FIG. 1, the computing system 900 of FIG. 9, or another device, combination of devices, or systems.

For simplicity of explanation, methods described herein are depicted and described as a series of acts. However, acts in accordance with this disclosure may occur in various orders and/or concurrently, and with other acts not presented and described herein. Further, not all illustrated acts may be used to implement the methods in accordance with the disclosed subject matter. In addition, those skilled in the art will understand and appreciate that the methods may alternatively be represented as a series of interrelated states via a state diagram or events. Additionally, the methods disclosed in this specification are capable of being stored on an article of manufacture, such as a non-transitory computer-readable medium, to facilitate transporting and transferring such methods to computing devices. The term article of manufacture, as used herein, is intended to encompass a computer program accessible from any computer-readable device or storage media. Although illustrated as discrete blocks, various blocks may be divided into additional blocks, combined into fewer blocks, or eliminated, depending on the desired implementation.

The method 600 may begin at block 602, where the processing logic may transmit a begin identifier and a driver address on a signal line. In some embodiments, the driver address may identify a driver of multiple drivers included in a voltage regulator system. Alternatively, or additionally, the driver address may indicate the driver of the multiple drivers that may be configured to subsequently transmit on the signal line.

At block 604, the processing logic may receive an acknowledgement signal, temperature data, fault data, and parity check data on the signal line. In some embodiments, the acknowledgement signal, the temperature data, the fault data, and the parity check data may be received from the driver identified by the driver address of block 602.

In some embodiments, the processing logic may verify the acknowledgment signal is set to an expected value prior to receiving the temperature data, the fault data, and/or the parity check data. In instances in which the acknowledgement signal is not received, the processing logic may be configured to remove the driver associated with the driver address from an active driver list. In some embodiments, the processing logic may be configured to latch the temperature data and/or the fault data upon verifying the parity check data.

At block 606, the processing logic may transmit an end identifier on the signal line. In some embodiments, the processing logic may be configured to repeat the method 600 with each driver of the multiple drivers in the voltage regulator system. For example, in instances in which three drivers are included in the voltage regulator system, the processing logic may sequentially perform the method 600 with respect to each driver of the three drivers.

In some embodiments, each driver that receives the begin identifier may be configured to resynchronize the driver sampling position.

Modifications, additions, or omissions may be made to the method 600 without departing from the scope of the present disclosure. For example, the method 600 may include one or more waiting periods before receiving the acknowledgement signal or after receiving the parity check data in block 604. In some embodiments, the one or more waiting periods may be configured to reduce overlap between transmissions such that the likelihood of losing or corrupting data may be reduced.

FIG. 7 illustrates another example transmission frame 700 configured for temperature data and fault data transmissions on a signal line, in accordance with at least one embodiment described in the present disclosure. In some embodiments, the transmission frame 700 may include a header definition 710, a controller response 740, a first driver response 750, and a second driver response 760. The header definition 710 may include a begin identifier 712, a driver address 714, a first window 716, an acknowledgement signal 718, temperature data 720, fault data 722, parity check data 724, a second window 726, an end identifier 728, a first fault window 730, a second fault window 732, and a third fault window 734.

In some embodiments, the header definition 710 may be substantially the same or similar to the header definition 510 of FIG. 5, with the inclusion of the first fault window 730, the second fault window 732, and the third fault window 734 in the header definition 710.

In some embodiments, the first fault window 730, the second fault window 732, and the third fault window 734 may be configured to permit any driver included in a voltage regulator system to transmit on a shared signal line. In some embodiments, the first fault window 730, the second fault window 732, and the third fault window 734 may be designated for transmissions of catastrophic faults that may benefit from a timely resolution and/or response. In some embodiments, the first fault window 730, the second fault window 732, and the third fault window 734 may reduce the latency of the voltage regulator system with regard to catastrophic fault transmissions. For example, in instances in which a clock associated with the voltage regulator system is 50 MHz, the latency for catastrophic fault transmissions may be reduced to approximately 1 μs. Alternatively, or additionally, the latency may be higher or lower depending on the clock frequency.

In some embodiments, the controller response 740 and the first driver response 750 may be similar to the controller response 540 and the driver response 550 of FIG. 5, with the exception of the responses during the first fault window 730, the second fault window 732, and the third fault window 734. For example, the controller response 740 may be high and the first driver response 750 may be low during the begin identifier 712, and the driver address 714 which may indicate the controller is transmitting the begin identifier 712, and the driver address 714 to the first driver. The controller response 740 may be low and the first driver response 750 may be high during the acknowledgement signal 718, the temperature data 720, the fault data 722, and the parity check data 724, which may indicate the driver is transmitting an acknowledgement signal in response to earlier transmissions by the controller to the driver, temperature data, fault data, and parity check data. In some embodiments, the controller response 740 may be high and the first driver response 750 may be low during the end identifier 728, which may indicate the controller is ending transmissions to the first driver.

In some embodiments, both the controller response 740 and the first driver response 750 may be low during the first window 716 and the second window 726, which may help prevent overlap between transmitted signals between the controller and the first driver. Alternatively, or additionally, both the controller response 740 and the first driver response 750 may be low during the first fault window 730, the second fault window 732, and the third fault window 734, which may be used for fault transmissions by a driver that may be experiencing a catastrophic fault.

As illustrated, the second driver response 760 may be low during transmissions between the controller and the first driver, as the controller may have provided the address of the first driver in the driver address 714. Alternatively, or additionally, in instances in which the second driver may experience a catastrophic fault, the second driver response 760 may be configured to be high during the first fault window 730, the second fault window 732, and the third fault window 734 during which the controller response 740 and the first driver response 750 may be low. In some embodiments, any driver in the voltage regulator system experiencing a catastrophic fault may be configured to transmit during the first fault window 730, the second fault window 732, and the third fault window 734.

Modifications, additions, or omissions may be made to the transmission frame 700 without departing from the scope of the present disclosure. For example, in some embodiments, the transmission frame 700 may include any number of other components that may not be explicitly illustrated or described.

FIG. 8 illustrates a flowchart of another example method 800 for fault communication in voltage regulator systems, in accordance with at least one embodiment described in the present disclosure.

The method 800 may be performed by processing logic that may include hardware (circuitry, dedicated logic, etc.), software (such as is run on a computer system or a dedicated machine), or a combination of both, which processing logic may be included in the controller 110 of FIG. 1, the computing system 900 of FIG. 9, or another device, combination of devices, or systems.

For simplicity of explanation, methods described herein are depicted and described as a series of acts. However, acts in accordance with this disclosure may occur in various orders and/or concurrently, and with other acts not presented and described herein. Further, not all illustrated acts may be used to implement the methods in accordance with the disclosed subject matter. In addition, those skilled in the art will understand and appreciate that the methods may alternatively be represented as a series of interrelated states via a state diagram or events. Additionally, the methods disclosed in this specification are capable of being stored on an article of manufacture, such as a non-transitory computer-readable medium, to facilitate transporting and transferring such methods to computing devices. The term article of manufacture, as used herein, is intended to encompass a computer program accessible from any computer-readable device or storage media. Although illustrated as discrete blocks, various blocks may be divided into additional blocks, combined into fewer blocks, or eliminated, depending on the desired implementation.

The method 800 may begin at block 802, where the processing logic may transmit a begin identifier and a driver address on a signal line. In some embodiments, the driver address may identify a driver of multiple drivers included in a voltage regulator system. Alternatively, or additionally, the driver address may indicate the driver of the multiple drivers that may be configured to subsequently transmit on the signal line.

At block 804, the processing logic may receive an acknowledgement signal on the signal line. In some embodiments, the acknowledgement signal may be received from the driver identified by the driver address of block 802. In instances in which the acknowledgement signal is not received, the processing logic may be configured to remove the driver associated with the driver address from an active driver list.

At block 806, the processing logic may provide a first catastrophic fault window on the signal line. In some embodiments, any driver included in a voltage regulator system may be configured to transmit during the first catastrophic fault window. Alternatively, or additionally, drivers experiencing a catastrophic fault may be permitted to transmit during the first catastrophic fault window while drivers not experiencing a catastrophic fault may be restricted from transmitting during the first catastrophic fault window.

At block 808, the processing logic may receive temperature data on the signal line. In some embodiments, the temperature data may be received from the driver identified by the driver address of block 802.

At block 810, the processing logic may provide a second catastrophic fault window on the signal line. In some embodiments, any driver included in the voltage regulator system may be configured to transmit during the second catastrophic fault window. Alternatively, or additionally, drivers experiencing a catastrophic fault may be permitted to transmit during the second catastrophic fault window while drivers not experiencing a catastrophic fault may be restricted from transmitting during the second catastrophic fault window.

At block 812, the processing logic may receive fault data and parity check data on the signal line. In some embodiments, the fault data and the parity check data may be received from the driver identified by the driver address of block 802. In some embodiments, the processing logic may be configured to latch the temperature data and/or the fault data upon verifying the parity check data.

At block 814, the processing logic may transmit an end identifier on the signal line. In some embodiments, the processing logic may be configured to repeat the method 800 with each driver of the multiple drivers in the voltage regulator system. For example, in instances in which three drivers are included in the voltage regulator system, the processing logic may sequentially perform the method 800 with respect to each driver of the three drivers.

At block 816, the processing logic may provide a third catastrophic fault window on the signal line. In some embodiments, any driver included in the voltage regulator system may be configured to transmit during the third catastrophic fault window. Alternatively, or additionally, drivers experiencing a catastrophic fault may be permitted to transmit during the third catastrophic fault window while drivers not experiencing a catastrophic fault may be restricted from transmitting during the third catastrophic fault window.

Modifications, additions, or omissions may be made to the method 800 without departing from the scope of the present disclosure. For example, the method 800 may include one or more waiting periods before receiving the acknowledgement signal in block 804 or after receiving the parity check data in block 812. In some embodiments, the one or more waiting periods may be configured to reduce overlap between transmissions such that the likelihood of losing or corrupting data may be reduced.

FIG. 9 illustrates an example computing system 900 that may be used for fault communication in voltage regulator systems, in accordance with at least one embodiment described in the present disclosure. The computing system 900 may be configured to implement or direct one or more operations associated with fault communications in voltage regulator systems, which may include controller 110, the first driver 120, and/or the second driver 130 of FIG. 1. The computing system 900 may include a processor 902, memory 904, data storage 906, and a communication unit 908, which all may be communicatively coupled. In some embodiments, the computing system 900 may be part of any of the systems or devices described in this disclosure.

For example, the computing system 900 may be part of the controller 110, the first driver 120 and/or the second driver 130 of FIG. 1 and may be configured to perform one or more of the tasks described above with respect to the controller 110, the first driver 120 and/or the second driver 130, respectively.

The processor 902 may include any computing entity, or processing device including various computer hardware or software modules and may be configured to execute instructions stored on any applicable computer-readable storage media. For example, the processor 902 may include a microprocessor, a microcontroller, a parallel processor such as a graphics processing unit (GPU) or tensor processing unit (TPU), a digital signal processor (DSP), an application-specific integrated circuit (ASIC), a Field-Programmable Gate Array (FPGA), or any other digital or analog circuitry configured to interpret and/or to execute program instructions and/or to process data.

Although illustrated as a single processor in FIG. 9, it is understood that the processor 902 may include any number of processors distributed across any number of networks or physical locations that are configured to perform individually or collectively any number of operations described herein.

In some embodiments, the processor 902 may be configured to interpret and/or execute program instructions and/or process data stored in the memory 904, the data storage 906, or the memory 904 and the data storage 906. In some embodiments, the processor 902 may fetch program instructions from the data storage 906 and load the program instructions in the memory 904. After the program instructions are loaded into memory 904, the processor 902 may execute the program instructions.

For example, in some embodiments, the processor 902 may be configured to interpret and/or execute program instructions and/or process data stored in the memory 904, the data storage 906, or the memory 904 and the data storage 906. The program instruction and/or data may be related to optical network unit activation and low latency transmissions in delay sensitive networks such that the computing system 900 may perform or direct the performance of the operations associated therewith as directed by the instructions. In these and other embodiments, the instructions may be used to perform the method 800 of FIG. 8.

The memory 904 and the data storage 906 may include computer-readable storage media or one or more computer-readable storage mediums for carrying or having computer-executable instructions or data structures stored thereon. Such computer-readable storage media may be any available media that may be accessed by a computer, such as the processor 902.

By way of example, and not limitation, such computer-readable storage media may include non-transitory computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store particular program code in the form of computer-executable instructions or data structures and which may be accessed by a computer. Combinations of the above may also be included within the scope of computer-readable storage media.

Computer-executable instructions may include, for example, instructions and data configured to cause the processor 902 to perform a certain operation or group of operations as described in this disclosure. In these and other embodiments, the term "non-transitory" as explained in the present disclosure should be construed to exclude only those types of transitory media that were found to fall outside the scope of patentable subject matter in the Federal Circuit decision of In re Nuijten, 500 F.3d 1346 (Fed. Cir. 2007). Combinations of the above may also be included within the scope of computer-readable media.

The communication unit 908 may include any component, device, system, or combination thereof that is configured to transmit or receive information over a network. In some embodiments, the communication unit 908 may communicate with other devices at other locations, the same location, or even other components within the same system. For example, the communication unit 908 may include a modem, a network card (wireless or wired), an infrared communication device, a wireless communication device (such as an antenna implementing 4G (LTE), 4.5G (LTE-A), and/or 5G (mmWave) telecommunications), and/or chipset (such as a Bluetooth® device (e.g., Bluetooth 5 (Bluetooth Low Energy)), an 802.6 device (e.g., Metropolitan Area Network (MAN)), a Wi-Fi device (e.g., IEEE 802.11ax, a WiMax device, cellular communication facilities, etc.), and/ or the like. The communication unit 908 may permit data to be exchanged with a network and/or any other devices or systems described in the present disclosure. For example, when the computing system 900 is included in controller 110 of FIG. 1, the communication unit 908 may allow the controller 110 to communicate with the first driver 120 and/or the second driver 130 of FIG. 1.

Modifications, additions, or omissions may be made to the computing system 900 without departing from the scope of the present disclosure. For example, in some embodiments, the computing system 900 may include any number of other components that may not be explicitly illustrated or described. Further, depending on certain implementations, the computing system 900 may not include one or more of the components illustrated and described.

As indicated above, the embodiments described herein may include the use of a computing system (e.g., the processor 902 of FIG. 9) including various computer hardware or software modules. Further, as indicated above, embodiments described herein may be implemented using computer-readable media (e.g., the memory 904 of FIG. 9) for carrying or having computer-executable instructions or data structures stored thereon.

In some embodiments, the different components, modules, engines, and services described herein may be implemented as objects or processes that execute on a computing system (e.g., as separate threads). While some of the systems and methods described herein are generally described as being implemented in software (stored on and/or executed by hardware), specific hardware implementations or a combination of software and specific hardware implementations are also possible and contemplated.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements. For example, a first widget may be described as having a first side and a second widget may be described as having a second side. The use of the term "second side" with respect to the second widget may be to distinguish such side of the second widget from the "first side" of the first widget and not to connote that the second widget has two sides.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the present disclosure.

What is claimed is:

1. A system, comprising: a voltage regulator controller configured to maintain a phase voltage; a driver associated with the phase voltage, the driver including a first signal line communicatively coupled to the voltage regulator controller, wherein the driver is configured to transmit a multiplexed signal on the first signal line to the voltage regulator controller, wherein a first ring oscillator configured to be the voltage regulator controller clock input and a second ring oscillator configured to be a driver clock input, the first ring oscillator and the second ring oscillator configured to provide asynchronous timing to the voltage regulator controller and the driver.

2. The system of claim 1, further comprising:
a second signal line communicatively coupling the voltage regulator controller and the driver, the second signal line configured to facilitate continuous transmissions of current data from the driver to the voltage regulator controller;
a third signal line communicatively coupling the voltage regulator controller and the driver, the third signal line configured to support addressing operations between the voltage regulator controller and the driver and pulse width modulated signals; and
a fourth signal line communicatively coupling the voltage regulator controller and the driver, the fourth signal line configured to support transmissions of fault data from the driver to the voltage regulator controller.

3. The system of claim 2, wherein the current data transmitted on the second signal line is a digital signal, the current data being converted to the digital signal in the driver and converted to an analog signal in the voltage regulator controller.

4. The system of claim 3, wherein the driver converts the current data to the digital signal using a delta-sigma analog to digital converter and the voltage regulator controller converts the current data to the analog signal using a decimation filter and a digital to analog converter.

5. The system of claim 1, wherein the multiplexed signal includes temperature data and fault data from the driver.

6. The system of claim 1, wherein the first signal line is configured to support transmissions that include a transmission frame, the transmission frame including a driver address element, a temperature data element, a fault data element, and parity check data for error correction.

7. The system of claim 6, wherein the transmission frame includes one or more second fault data elements.

8. The system of claim 1, further comprising a toggle device configured to cause the driver to transmit temperature data as a non-multiplexed signal on the first signal line.

9. A system, comprising:
a voltage regulator controller configured to maintain a plurality of phase voltages; and
a plurality of drivers each associated with a phase voltage of the plurality of phase voltages, the plurality of drivers each including a first signal line of a plurality of first signal lines shorted together and communicatively coupled to the voltage regulator controller, wherein the plurality of drivers are configured to individually transmit a multiplexed signal on the first signal line to the voltage regulator controller,
wherein the first signal line is configured to support transmissions that include a transmission frame, the transmission frame including at least one of: a driver address element, a temperature data element, a fault data element, parity check data for error correction, or one or more second fault data elements.

10. The system of claim 9, further comprising:
a plurality of second signal lines each communicatively coupling the voltage regulator controller and the plurality of drivers, the plurality of second signal lines configured to support continuous transmissions of a plurality of current data from the plurality of drivers to the voltage regulator controller;
a plurality of third signal lines each communicatively coupling the voltage regulator controller and the plurality of drivers, the plurality of third signal lines configured to support addressing operations between the voltage regulator controller and the plurality of drivers and pulse width modulated signals; and
a plurality of fourth signal lines communicatively coupling the voltage regulator controller and the plurality of drivers, each fourth signal line of the plurality of fourth signal lines shorted together and configured to support transmissions of fault data from the plurality of drivers to the voltage regulator controller.

11. The system of claim 10, wherein the plurality of current data transmitted on the plurality of second signal lines are digital signals, the plurality of current data being converted to a digital signal in the plurality of drivers and converted to an analog signal in the voltage regulator controller.

12. The system of claim 10, wherein the addressing operations are transmitted from the voltage regulator controller to the plurality of drivers one or more times to obtain a registration of an address of each driver of the plurality of drivers.

13. The system of claim 9, wherein the multiplexed signal includes temperature data and fault data from each driver of the plurality of drivers.

14. The system of claim 9, further comprising a plurality of toggle devices, each toggle device of the plurality of toggle devices configured to cause a driver of the plurality of drivers to individually transmit temperature data as a non-multiplexed signal on the first signal line.

15. A method, comprising:
- transmitting a driver address on a signal line, the driver address configured to identify a first driver of a plurality of drivers;
- receiving an acknowledgement signal, temperature data, and fault data from the first driver on the signal line;
- providing a first window on the signal line before receiving the temperature data, the first window configured to permit a transmission from any driver of the plurality of drivers;
- providing a second window on the signal line after receiving the temperature data, the second window configured to permit a transmission from any driver of the plurality of drivers;
- providing a third window on the signal line after receiving an end identifier, the second window configured to permit a transmission from any driver of the plurality of drivers; and
- receiving a second fault signal from the first driver during any of the first window, the second window, or the third window.

16. The method of claim 15, further comprising:
- transmitting a second driver address on the signal line, the second driver address configured to identify a second driver of the plurality of drivers; and
- receiving second temperature data and second fault data on the signal line from the second driver.

17. The method of claim 15, wherein transmitting the driver address on the signal line includes transmitting a begin identifier.

* * * * *